United States Patent
Schrom et al.

(10) Patent No.: US 8,975,975 B2
(45) Date of Patent: Mar. 10, 2015

(54) SPREAD SPECTRUM CLOCKING METHOD FOR WIRELESS MOBILE PLATFORMS

(75) Inventors: Gerhard Schrom, Hillsboro, OR (US); William Dawson Kesling, Davis, CA (US); Alexander Lalexan Lyakhov, Portland, OR (US); Maynard C. Falconer, Portland, OR (US); Harry G. Skinner, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 64 days.

(21) Appl. No.: 13/994,552

(22) PCT Filed: Mar. 30, 2012

(86) PCT No.: PCT/US2012/031536
§ 371 (c)(1),
(2), (4) Date: Jun. 14, 2013

(87) PCT Pub. No.: WO2013/147861
PCT Pub. Date: Oct. 3, 2013

(65) Prior Publication Data
US 2013/0335151 A1 Dec. 19, 2013

(51) Int. Cl.
*H03B 29/00* (2006.01)
*H03L 7/00* (2006.01)
*H04B 1/71* (2011.01)

(52) U.S. Cl.
CPC *H03L 7/00* (2013.01); *H03B 29/00* (2013.01); *H04B 1/71* (2013.01)

USPC ...... 331/78; 331/2; 331/46; 331/74; 375/376; 327/156; 327/117; 332/117; 332/127

(58) Field of Classification Search
CPC ....................................... H03B 29/00
USPC ............. 331/78, 2, 46, 74; 375/376; 327/156, 327/117; 332/117, 127
See application file for complete search history.

(56) References Cited

U.S. PATENT DOCUMENTS

| | | | |
|---|---|---|---|
| 5,872,807 A | 2/1999 | Booth et al. | |
| 6,175,259 B1 | 1/2001 | Mann et al. | |
| 6,606,005 B2 * | 8/2003 | Chang | 331/78 |
| 7,042,258 B2 | 5/2006 | Booth et al. | |
| 7,443,215 B1 * | 10/2008 | Sidiropoulos | 327/156 |
| 7,676,012 B1 * | 3/2010 | Venugopal et al. | 375/376 |
| 2008/0107154 A1 | 5/2008 | Hsiao-Chyi | |

OTHER PUBLICATIONS

"PCT Notification of Transmittal of the International Search Report and the Written Opinion of the International Searching Authority, or the Declaration", dated Nov. 30, 2012, for International Application No. PCT/US2012/031536, 9pgs.

* cited by examiner

*Primary Examiner* — Arnold Kinkead
(74) *Attorney, Agent, or Firm* — Buckley, Maschoff & Talwalkar LLC (57) ABSTRACT

According to some embodiments, a method and apparatus are provided to vary a clock signal frequency for a first time period between a lower limit of a range of problematic frequencies and a frequency lower than the lower limit, and vary the clock signal frequency for a second period of time between an upper limit of the range of problematic frequencies and a frequency greater than the upper limit.

17 Claims, 11 Drawing Sheets

100

| Oscillating a clock signal frequency for a first time period between a lower limit of a range of problematic frequencies and a frequency lower than the lower limit    101 |

| Oscillating the clock signal frequency for a second period of time between an upper limit of the range of problematic frequencies and a frequency greater than the upper limit    102 |

Varying the frequency of a clock signal for a first time period between a frequency lower than a lower limit of a range of problematic frequencies and the lower limit of the clock frequency deviation  401

↓

Varying the frequency of the clock signal for a second time period between the limit of a range of problematic frequencies and the frequency lower than the lower limit  402

↓

Varying the frequency of the clock signal for a third period of time between a frequency greater than an upper limit of the range of problematic frequencies and the upper limit of the range of problematic frequencies  403

↓

Varying the frequency of the clock signal for a fourth period of time between the upper limit of the range of problematic frequencies and a frequency greater than an upper limit of the range of problematic frequencies.  404

SPREAD SPECTRUM CLOCKING METHOD FOR WIRELESS MOBILE PLATFORMS

BACKGROUND OF THE INVENTION

System clock harmonics and Input/Output ("I/O") clock harmonics are a main source of interference with wireless receivers that reside in a computing platform. For example, many radios used for wireless communication operate near 2.5 GHz which is a harmonic of a 100 MHz clock.

Conventional methods of reducing wireless interference from clock harmonics rely on shielding material and/or absorption material being added to a computer system to reduce reception of the clock harmonics. However, shielding adds additional cost and weight to the computer system, sometimes also requiring larger board areas.

DETAILED DESCRIPTION OF EXAMPLE EMBODIMENTS

The present embodiments relate to a method of spread spectrum clock control which may reduce radiated energy in selected portions of a frequency spectrum. The reduction of radiated energy may be associated with reducing amplitudes of problematic frequencies that correspond to harmonics of a clock signal. The problematic frequencies may also be associated with radio frequencies that are in use by a wireless network interface device. Reducing the amplitudes of problematic frequencies may comprise creating a notch in a frequency spectrum.

Figure 1:
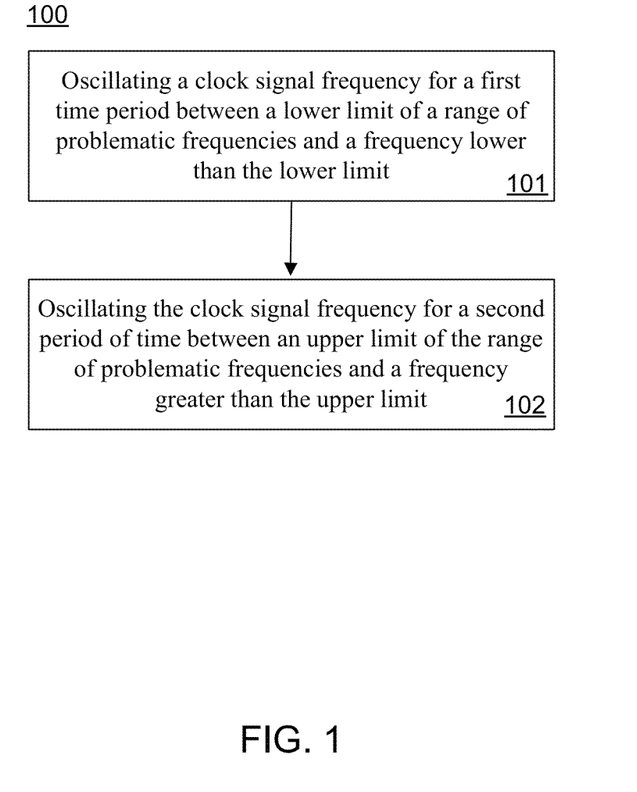
FIG. 1 illustrates a method according to some embodiments.

Referring now to FIG. 1, an embodiment of a method 100 is illustrated. The method 100 may be performed by an apparatus such as, but not limited to, the apparatus of FIG. 10. Furthermore, the method 100 may be embodied on a non-transitory computer-readable medium.

The method 100 may relate to a method of reducing amplitudes of problematic frequencies associated with a clock signal while minimizing clock jitter where clock jitter may be defined as an undesired deviation from true periodicity of a periodic clock signal. The present embodiments may also simultaneously improve radio frequency interference ("RFI") mitigation by reducing a number of clock frequency transitions across a problematic frequency range.

Figure 2:
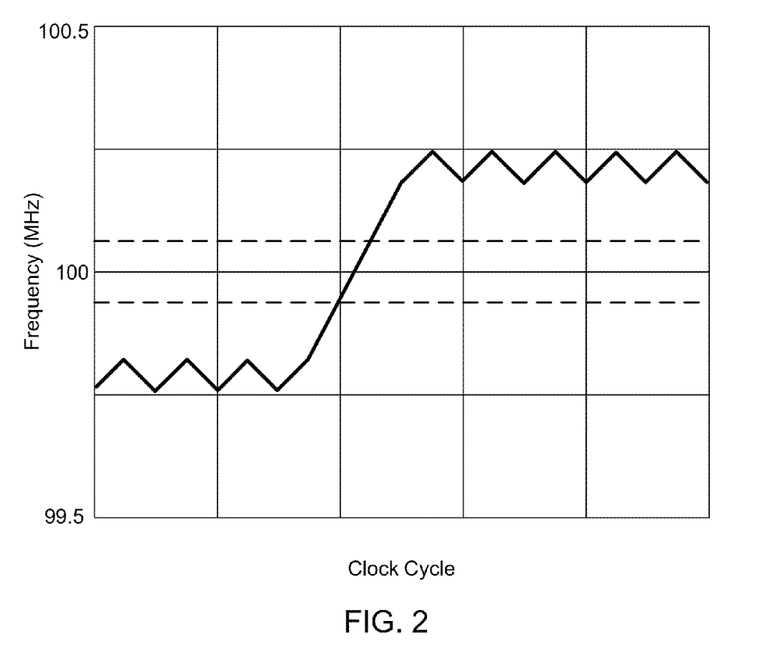
FIG. 2 illustrates a graph of clock frequency versus clock cycles according to some embodiments.

At 101, a clock signal's frequency is varied with a first oscillation (e.g., the frequency is oscillated) for a first time period between a lower limit of a range of problematic clock frequencies and a clock frequency lower than the lower limit. The first time period may be associated with a first spreading region (e.g., a lower spreading region). As illustrated in FIG. 2, problematic frequencies may be defined as a range surrounding a known frequency that may result in a problematic clock harmonic. In the present embodiment, a range is illustrated by the dashed lines above and below the frequency of 100 MHz which corresponds to a clock signal at a frequency of 100 MHz.

Referring back to FIG. 1, at 102, the clock signal's frequency is varied with a second oscillation (e.g., the frequency is oscillated) for a second period of time between an upper limit of the range of problematic frequencies and a frequency greater than the upper limit. The second time period may be associated with a second spreading region (e.g., an upper spreading region). In some embodiments, the oscillation may comprise a triangle shaped oscillation.

In the present embodiment, the clock signal's frequency may be transitioned slowly across the range of problematic frequencies. This transition may occur over a time period greater than or equal to half of a period of the oscillation of the clock frequency (e.g., half of a period of a clock frequency oscillation between transitions).

In some embodiments, the number of triangular periods in the upper and lower spreading regions may be increased to provide greater wireless interference mitigation by reducing a number of times that the range of problematic frequencies is crossed. An upper limit of the number of triangle frequencies may be imposed by the standardized EMI measurement dwell times of 100~1000 ms. In some embodiments, a period of a triangular frequency change may be between 30 kHz and 35 kHz.

Figure 2A:
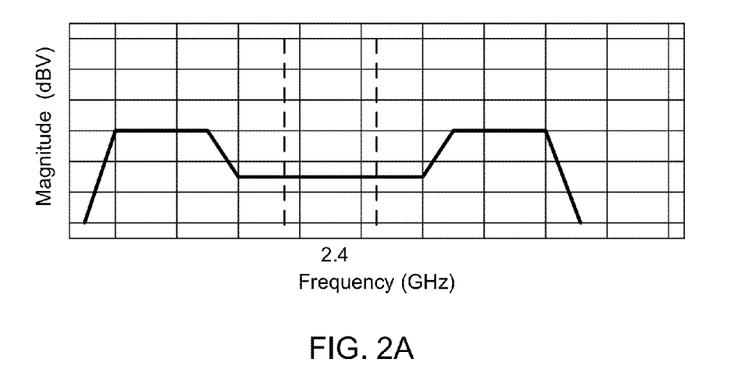
FIG. 2A illustrates a frequency spectrum according to some embodiments.

A number of triangular periods may not be constrained to be an integer or half-integer multiple, and may be randomized to reduce certain types of clock jitter. The aforementioned method may be implemented on existing hardware by reducing a spread amplitude and periodically toggling a clock frequency. In some embodiments, a software counter may be implemented to achieve required speeds. A spectral notch, as illustrated in FIG. 2A, may be moved by changing the amplitude of the triangles in one spreading region or the other. As further illustrated in FIG. 2A, the dashed lines indicate the range of problematic frequencies surrounding a problematic harmonic (e.g. 2.5 GHz) resulting from a clock signal frequency.

In some embodiments, harmonic energy may be spread equally in each region above and below the range of problematic frequencies for better EMI performance. This may be accomplished by varying a number of triangular periods in each region in inverse proportion to an amplitude of the triangles in that region. In some embodiments, a number of spreading regions may be increased beyond two for cases requiring multiple spectral gaps. Increasing a number of spreading regions may also provide an EMI benefit with quasi-peak detectors used below 1 GHz, even without adding frequency gaps.

Figure 3:
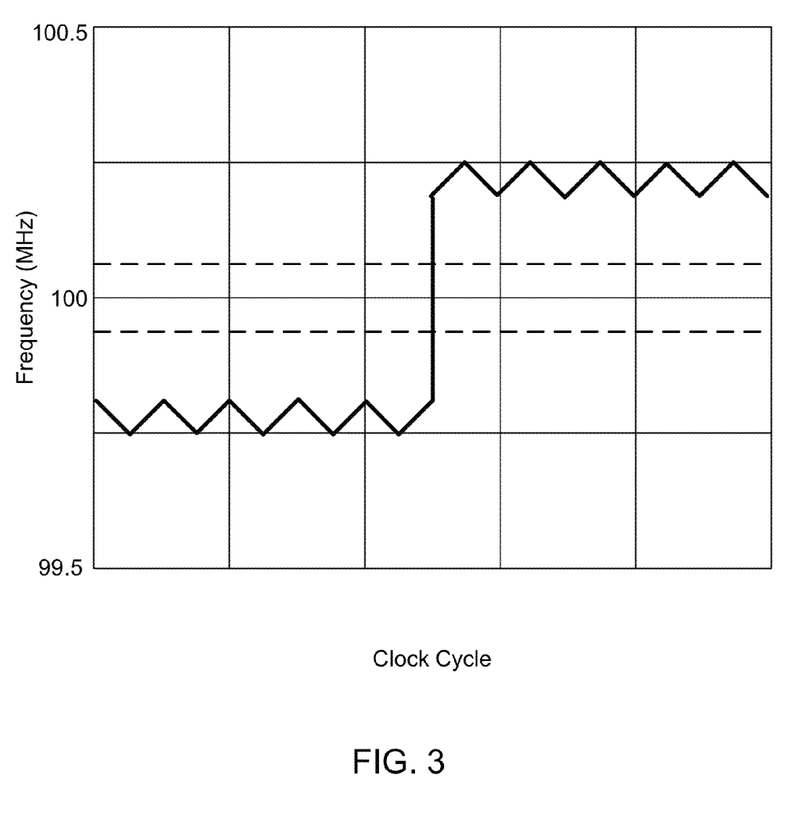
FIG. 3 illustrates a graph of clock frequency versus clock cycles according to some embodiments.

FIG. 3 relates to another embodiment of interference mitigation that may be achieved by increasing a rate of a frequency change through a range of problematic frequencies.

The present embodiment may provide greater interference mitigation than the embodiment of FIG. 2 and may be suitable for jitter-tolerant clocking applications such as switching voltage regulators and low-speed data interfaces (IO's). Inverting the polarity of triangles or using an integer (rather than half-integer) number of triangular periods in each region can improve RFI further in some cases.

Unlike the embodiment of FIG. 2, the triangular frequency variation of FIG. 3 is transitioned quickly across the range of problematic frequencies. This transition may occur over a time period less than half of a period of the oscillation of the clock frequency (e.g., less than half of a period of a clock frequency oscillation between transitions). For example, this transition may occur over a time of less than half of a period of a triangular variation.

Figure 4:
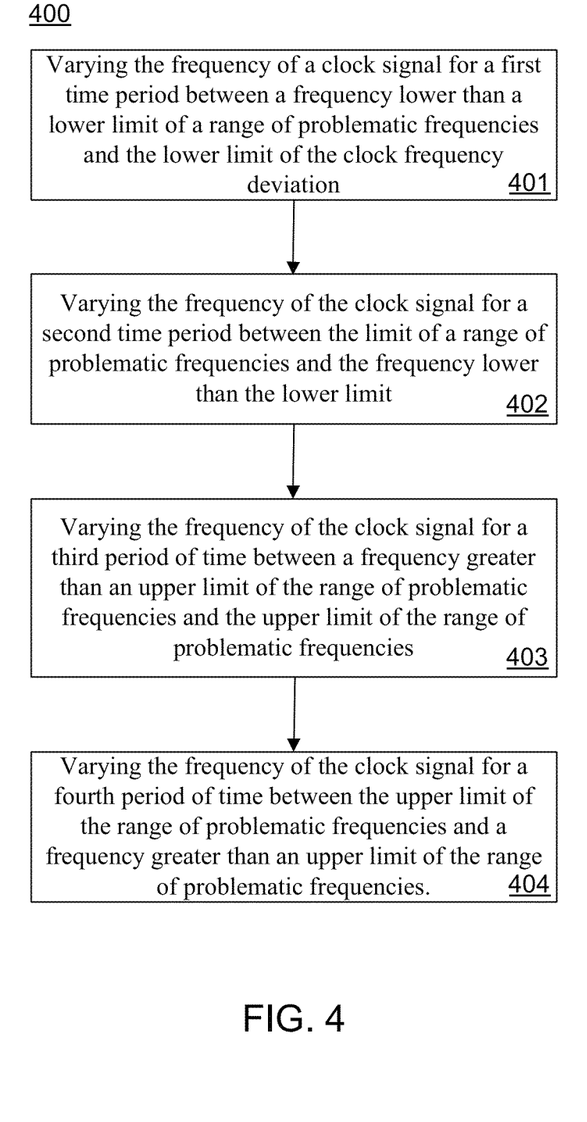
FIG. 4 illustrates a method according to some embodiments
Figure 5:
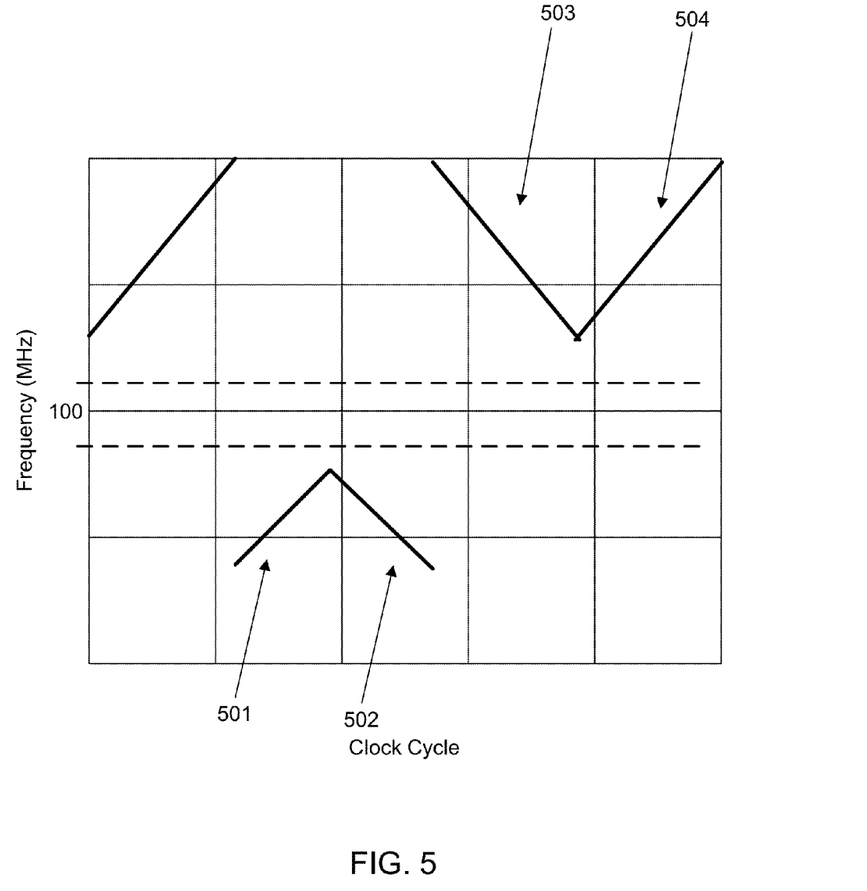
FIG. 5 illustrates a graph of clock frequency versus clock cycles according to some embodiments.

Now referring to FIG. 4, an embodiment of a method 400 is illustrated. In this embodiment, a number of triangular periods between transitions across the range of problematic frequencies is one, and the points where the transitions begin and end are moved away from the problematic frequency region. At 401, the frequency of a clock signal is varied for a first time period between a frequency lower than a lower limit of a range of problematic frequencies and the lower limit itself. As illustrated in FIG. 5, 501 illustrates a frequency of a clock signal being varied for a first time period between a frequency lower than a lower limit of a range of problematic frequencies and the lower limit itself. Next at 402, the frequency of the clock signal is varied for a second time period between the lower limit of a range of problematic frequencies and the frequency lower than the lower limit. Again, referring to FIG. 5, 502 illustrates a frequency of a clock signal being varied for a second time period between a lower limit of a range of problematic frequencies and a frequency lower than the lower limit. At 403, the frequency of the clock signal is varied for a third period of time between a frequency greater than an upper limit and the upper limit of the range of problematic frequencies. An example may be illustrated at 503 of FIG. 5.

Next, at 404, the frequency of the clock signal is varied for a fourth period of time between an upper limit of the range of problematic frequencies and a frequency greater than the upper limit. An example may be illustrated at 504 of FIG. 5. As further illustrated in FIG. 5, the range of problematic frequencies is passed over between transitions. The clock signal frequency may be transitioned across the range of problematic frequencies between the frequency lower than the lower limit and the frequency greater than the higher limit.

Figure 6:
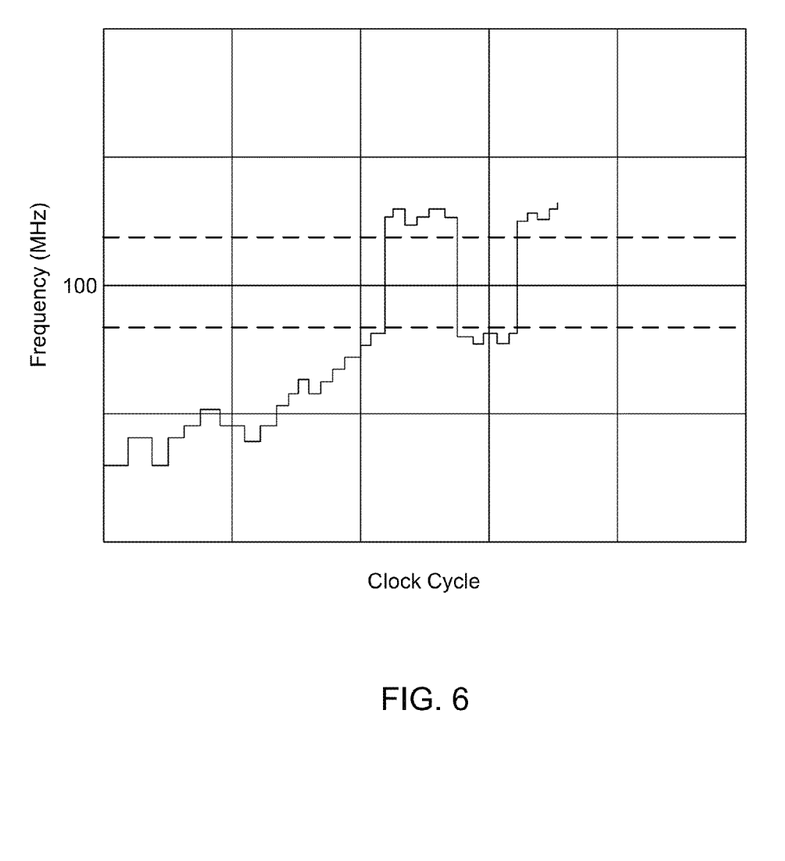
FIG. 6 illustrates a graph of clock frequency versus clock cycles according to some embodiments.

Now referring to FIG. 6, an embodiment of a random walk transition is illustrated. The previously described embodiments may not be limited to triangular or even periodic frequency variations. For example, a random walk spreading techniques may be implemented. A simple example of random walk is illustrated in FIG. 6. In this embodiment, a decision to increase or decrease a frequency of the clock signal is made at random after each clock cycle number of clock cycles. When a clock frequency nears or enters a range of problematic frequencies, a transition is made across the problematic frequency region. This transition may be made quickly or slowly, with or without dithering, at regular or irregular intervals, starting and ending near to or far from the edges of the interference range, and/or with single or multiple interference ranges.

Figure 7:
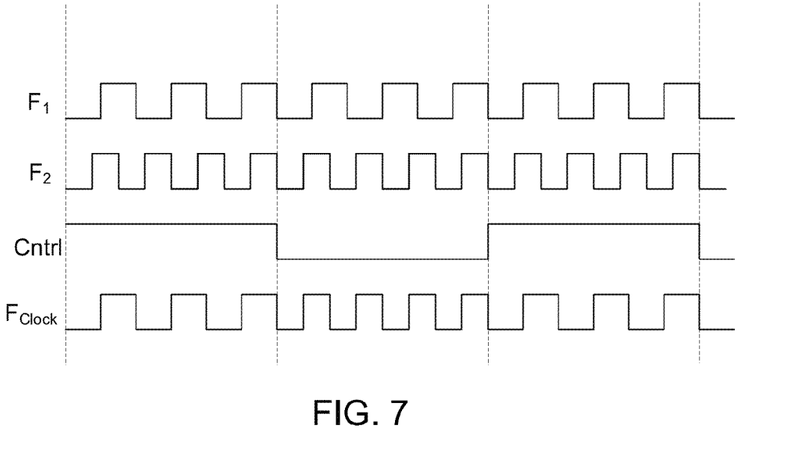
FIG. 7 illustrates frequency shift keying according to some embodiments.

Now referring to FIG. 7, an embodiment of binary frequency shift keying ("FSK") is illustrated. FSK may be used to spread clocks with a controlled harmonic spectrum much like it is used to modulate sinusoidal carriers in communications systems. Using this control permits reduction of clock spectral energy at problematic frequencies. As illustrated in FIG. 7, FSK switches between two clock frequencies ($F_1$ and $F_2$) using a control signal Cntrl to produce $F_{Clock}$. $F_1$ and $F_2$ may be considered "mark" and "space" frequencies respectively. As such, a first frequency associated with a clock signal may be received or produced, a second frequency associated with the clock signal may be received or produced, and a clock signal based on the first frequency and the second frequency may be output. Outputting may comprise switching the output clock frequency between the first frequency and the second frequency based on a received control signal. Accordingly the selection of problematic frequencies, associated with a frequency spectrum, to be reduced in energy may be made via the control signal.

AM (amplitude modulation) or FM (frequency modulation) sidebands may be created around the "mark" and "space" frequencies. The characteristic spectral peaks at these two frequencies themselves may be removed by periodic inversion of the underlying mark and space clock phases. This approach may offer a lower power alternative to phase interpolators (PIs) for integrated spread spectrum clock generation. Implementation for generating a 100 MHz spread clock by modulating a post-divider, loop divider, choice of post-dividers and choice of loop dividers are illustrated in FIGS. 8, 8A, 9, and 9A.

Figure 8:
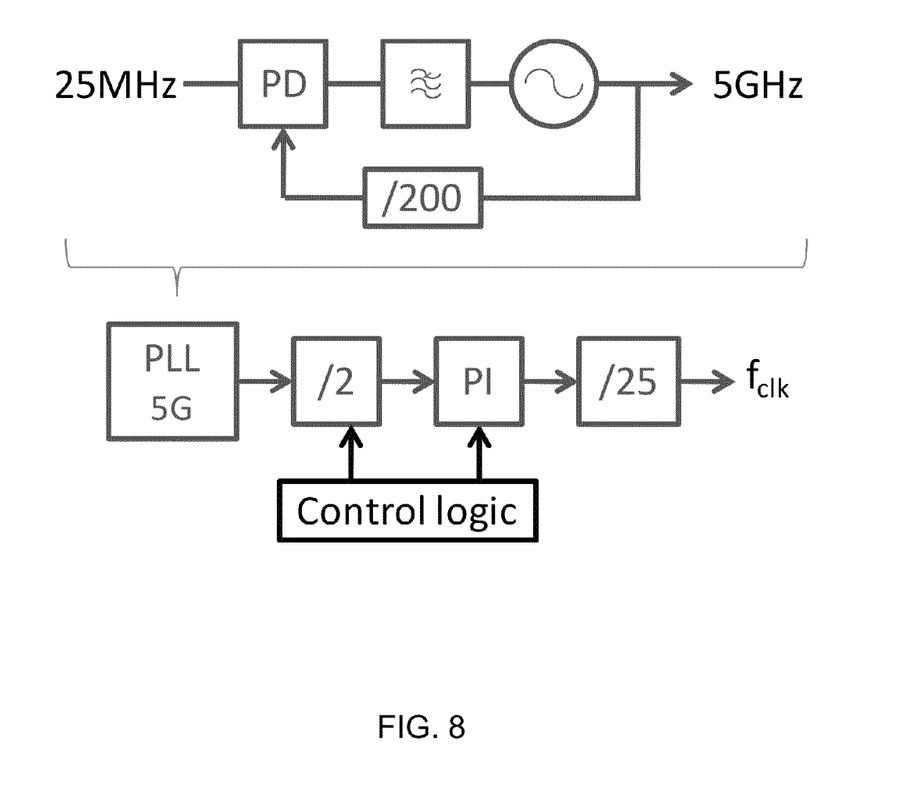
FIG. 8 illustrates a frequency shift keying apparatus according to some embodiments.
Figure 8A:
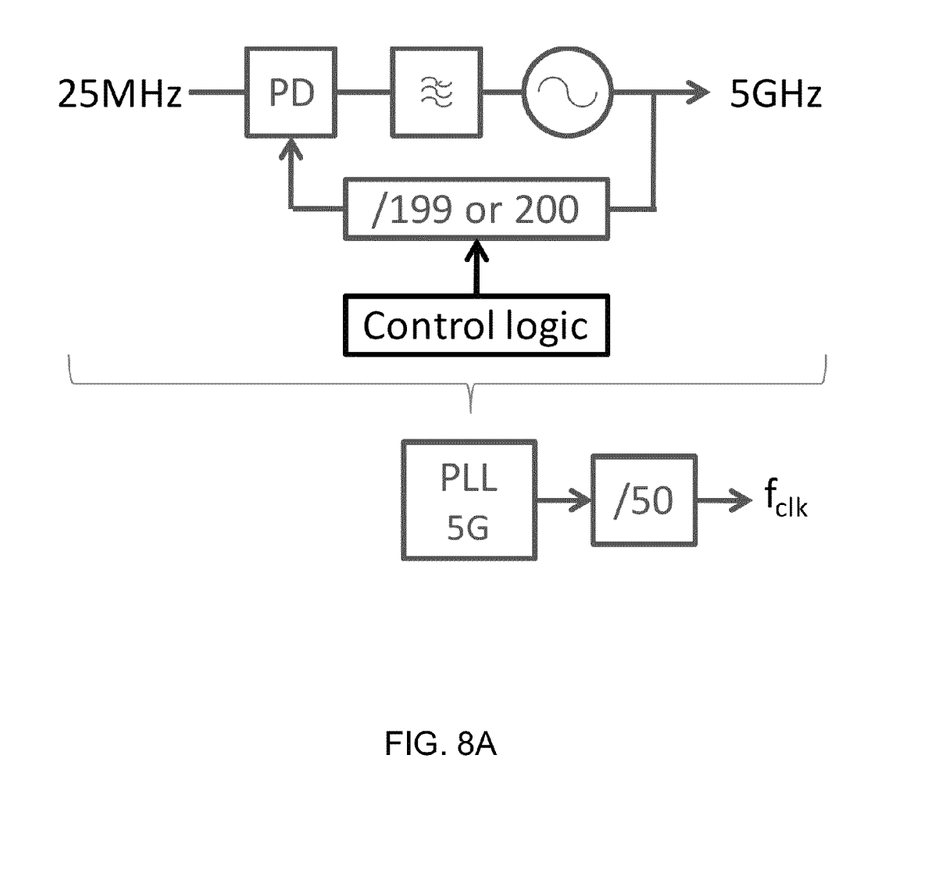
FIG. 8A illustrates a frequency shift keying apparatus according to some embodiments.

As illustrated in FIGS. 8 and 8A, a 25 MHz signal may be received at a phase detector ("PD") and divided by a loop divider (e.g., 199 or 200) the output of the phase detector may be sent through a controlled oscillator and then output. A loop divider of 199 may produce an output frequency of 4.975 GHz and a loop divider of 200 may produce an output frequency of 5 GHz. Therefore, the difference between the two frequencies is one half of one percent. These two frequencies may represent $F_1$ and $F_2$ as illustrated in FIG. 6. As further illustrated in FIG. 8, a phase lock loop ("PLL") at 5 GHz may be divided by 2, interpolated at a phase interpolator ("PI"), and then post divided by 25 to produce $F_{Clock}$. An upper portion of FIG. 8 illustrates a close-up of an internal side of a PLL block illustrated in a lower portion. As illustrated in FIG. 8A, a phase locked frequency may be post divided by 50 to produce $F_{Clock}$. In the embodiment of FIG. 8A, the phase interpolator is removed and thus power usage may be reduced. An upper portion of FIG. 8A illustrates a close-up of an internal side of a PLL block illustrated in a lower portion.

Figure 9:
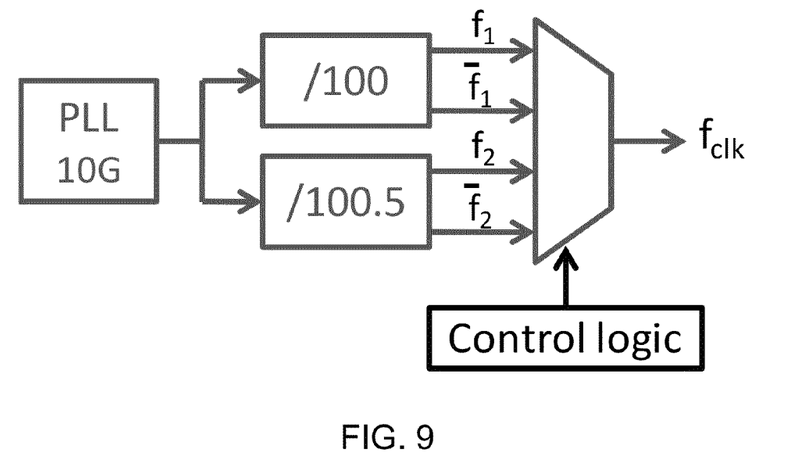
FIG. 9 illustrates a frequency shift keying apparatus according to some embodiments.
Figure 9A:
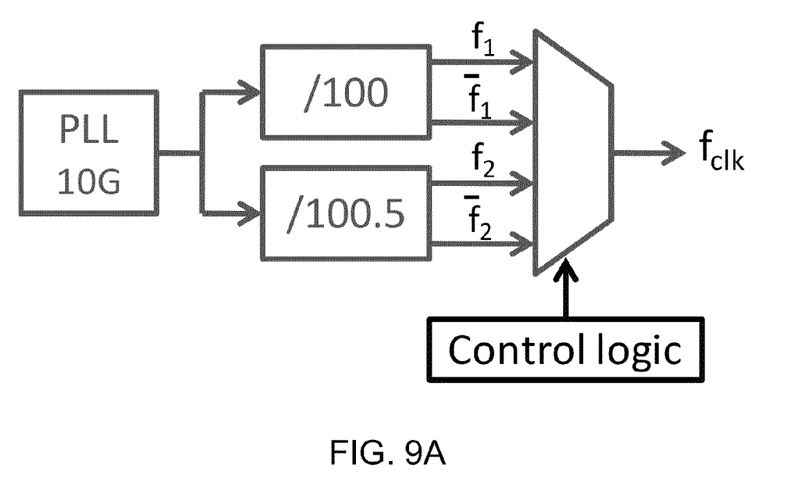
FIG. 9A illustrates a frequency shift keying apparatus according to some embodiments.

FIGS. 9 and 9A illustrate examples of implementing FSK using a multiplexer. In a first embodiment, as illustrated in FIG. 9, a phase locked loop clock frequency of 10 GHz may be used for two separate inputs to two separate division blocks, one that divides by 100 and one that divides by 100.5 (e.g, half of one percent difference). Output from the respective division blocks are $F_1$, $F_2$, an inverted $F_1$, and an inverted $F_2$ as illustrated in FIG. 9. These four signals are multiplexed (using control logic) to output an $F_{Clock}$ signal.

As illustrated in FIG. 9A, instead of a single phase locked loop clock signal at 10 GHz, a first input of a phase locked loop at 200*25 MHz and a second phase locked loop at 199*25 MHz are used as inputs to two separate division blocks. Each division block post divides the input by 50. Output from a first division block is $F_1$ and an inverted $F_1$, and output from a second division block is $F_2$ and an inverted $F_2$. The control logic may manipulate the multiplexer to output a clock signal such as $F_{Clock}$ as illustrated in FIG. 7. Alternately, the multiplexer can be placed between the two PLLs and a single divider.

In some implementations, overlap of the spread clock signal's spectral energy with problematic frequencies may be avoided by binary modulation of the control signal.

Figure 10:
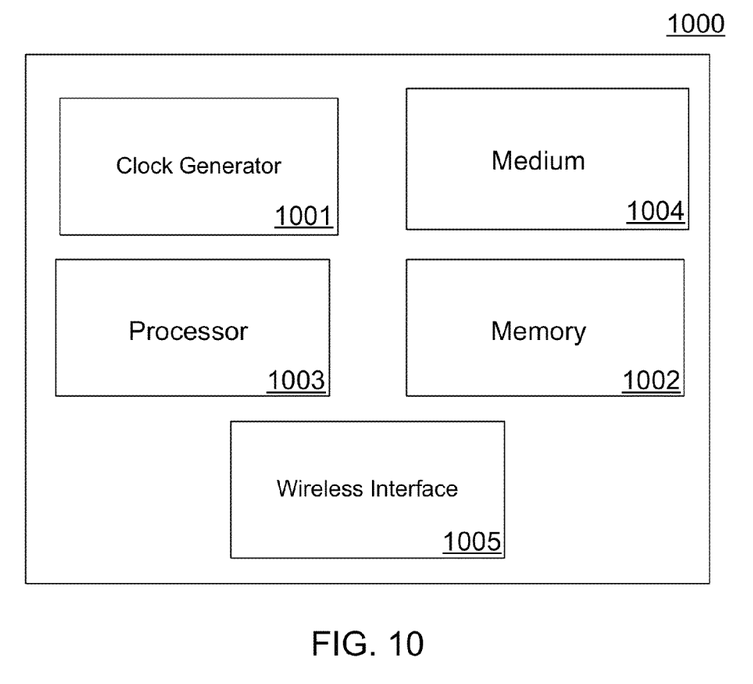
FIG. 10 illustrates a computing system according to some embodiments.

Now referring to FIG. 10, an embodiment of an apparatus 1000 is illustrated. The apparatus 1000 may comprise a clock generator 1001, a main memory 1002, a processor 1003, a medium 1004, and a wireless interface 1005. According to some embodiments, the apparatus 1000 may further comprise a digital display port, such as a port adapted to be coupled to a digital computer monitor, television, portable display screen, or the like.

The clock generator 1001 may comprise a circuit that produces a timing signal (e.g., a clock signal) to synchronize operation of apparatus 1000. In some embodiments, the clock generator 1001 may comprise a separate chip. However, in other embodiments, the clock generator 1001 may be integrated into another chip, such as on a die of the processor 1003.

The main memory 1002 may comprise any type of memory for storing data, such as, but not limited to, a Secure Digital (SD) card, a micro SD card, a Single Data Rate Random Access Memory (SDR-RAM), a Double Data Rate Random Access Memory (DDR-RAM), or a Programmable Read Only Memory (PROM). The main memory 1002 may comprise a plurality of memory modules.

The processor 1003 may include or otherwise be associated with dedicated registers, stacks, queues, etc. that are used to execute program code and/or one or more of these elements may be shared there between. In some embodiments, the processor 1003 may comprise an integrated circuit. In some embodiments, the processor 1003 may comprise circuitry to perform a method such as, but not limited to, the method described with respect to FIG. 1.

The medium 1004 may comprise any computer-readable medium that may store processor-executable instructions to be executed by the processor 1003 and in some cases the clock generator 1001 (e.g., the method 100). For example, the medium 1004 may comprise a non-transitory tangible medium such as, but is not limited to, a compact disk, a digital video disk, flash memory, optical storage, random access memory, read only memory, or magnetic media.

The wireless interface 1005 may comprise a wireless network interface controller (WNIC) to connect to a radio-based computer network. The wireless interface 1005 may comprise an antenna to communicate to the radio-based computer network.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Various modifications and changes may be made to the foregoing embodiments without departing from the broader spirit and scope set forth in the appended claims. The following illustrates various additional embodiments and do not constitute a definition of all possible embodiments, and those skilled in the art will understand that the present invention is applicable to many other embodiments. Further, although the following embodiments are briefly described for clarity, those skilled in the art will understand how to make any changes, if necessary, to the above-described apparatus and methods to accommodate these and other embodiments and applications.

What is claimed is:

1. A method comprising:
   oscillating, via a clock generator, a clock signal frequency for a first time period between a lower limit of a range of problematic frequencies and a frequency lower than the lower limit, wherein the range of problematic frequencies comprise a range surrounding a known frequency associated with a clock harmonic;
   transitioning, via a processor, the clock signal frequency across the range of problematic frequencies; and
   oscillating the clock signal frequency for a second period of time between an upper limit of the range of problematic frequencies and a frequency greater than the upper limit.

2. The method of claim 1,
   wherein transitioning the clock signal frequency across the range of problematic frequencies is over a time period greater than or equal to half of a period of a clock frequency oscillation between transitions.

3. The method of claim 1,
   wherein transitioning the clock signal frequency across the range of problematic frequencies is over a time period less than half of a period of a clock frequency oscillation between transitions.

4. The method of claim 1, wherein the clock signal frequency is a triangular frequency variation, and wherein a period of a clock signal frequency variation is between 30 kHz and 35 kHz.

5. The method of claim 1, wherein the clock signal frequency variation is a random walk.

6. An apparatus comprising:
   a clock generator, the clock generator to:
   oscillate a clock signal frequency for a first time period between a lower limit of a range of problematic frequencies and a frequency lower than the lower limit, wherein the range of problematic frequencies comprise a range surrounding a known frequency associated with a clock harmonic;
   and
   oscillate the clock signal frequency for a second period of time between an upper limit of the range of problematic frequencies and a frequency greater than the upper limit;
   and
   a processor, the processor to transition the clock signal frequency across the range of problematic frequencies.

7. The apparatus of claim 6, wherein
transitioning the clock signal frequency across the range of problematic frequencies is over a time period greater than or equal to half of a period of a clock frequency oscillation between transitions.

8. The apparatus of claim 6, wherein
transitioning the clock signal frequency across the range of problematic frequencies over a time period less than half of a period of a clock frequency oscillation between transitions.

9. The apparatus of claim 6, wherein the clock signal frequency is a triangular frequency variation, and wherein a period of a clock signal frequency variation is between 30 kHz and 35 kHz.

10. The apparatus of claim 6, wherein the clock signal frequency variation is a random walk.

11. A non-transitory computer-readable medium comprising instructions that when executed by a processor perform a method, the method comprising:
oscillating, via a clock generator, a clock signal frequency for a first time period between a lower limit of a range of problematic frequencies and a frequency lower than the lower limit, wherein the range of problematic frequencies comprise a range surrounding a known frequency associated with a clock harmonic;
transition the clock signal frequency, via the processor, across the range of problematic frequencies; and
oscillating, via the clock generator, the clock signal frequency for a second period of time between an upper limit of the range of problematic frequencies and a frequency greater than the upper limit.

12. The medium of claim 11,
wherein transitioning the clock signal frequency across the range of problematic frequencies is over a time period greater than or equal to half of a period of a clock frequency oscillation between transitions.

13. The medium of claim 11,
wherein transitioning the clock signal frequency across the range of problematic frequencies is over a time period less than half of a period of a clock frequency oscillation between transitions.

14. The medium of claim 11, wherein the clock signal frequency is a triangular frequency variation, and wherein a period of a clock signal frequency variation is between 30 kHz and 35 kHz.

15. The medium of claim 11, wherein clock signal frequency variation is a random walk.

16. A method comprising:
varying the frequency of a clock signal for a first time period between a frequency lower than a lower limit of a range of problematic frequencies and the lower limit of the clock frequency deviation, wherein the range of problematic frequencies comprise a range surrounding a known frequency associated with a clock harmonic;
varying the frequency of the clock signal for a second time period between the limit of a range of problematic frequencies and the frequency lower than the lower limit; and
transitioning, via a processor, the frequency of the clock signal across the range of problematic frequencies;
varying the frequency of the clock signal for a third period of time between a frequency greater than an upper limit of the range of problematic frequencies and the upper limit of the range of problematic frequencies, and
varying the frequency of the clock signal for a fourth period of time between the upper limit of the range of problematic frequencies and a frequency greater than an upper limit of the range of problematic frequencies.

17. The method of claim 16,
wherein transitioning the clock signal frequency across the range of problematic frequencies is between the frequency lower than the lower limit and the frequency greater than the upper limit of the range of problematic frequencies.

* * * * *